United States Patent [19]

Thaler

[11] Patent Number: 5,547,716
[45] Date of Patent: Aug. 20, 1996

[54] LASER ABSORPTION WAVE DEPOSITION PROCESS AND APPARATUS

[75] Inventor: Stephen L. Thaler, St. Louis, Mo.

[73] Assignee: McDonnell Douglas Corporation, St. Louis, Mo.

[21] Appl. No.: 346,641

[22] Filed: Nov. 28, 1994

Related U.S. Application Data

[63] Continuation-in-part of Ser. No. 62,202, May 17, 1993, abandoned.

[51] Int. Cl.$^6$ ............................ C23C 14/14; C23C 14/30; C23C 8/00; H05H 1/00
[52] U.S. Cl. ...................... 427/577; 427/579; 427/572; 427/582; 427/586; 427/596; 427/583; 427/597
[58] Field of Search ............................ 427/561, 566, 427/582, 583, 584, 586, 596, 597, 554, 555, 556, 216, 572, 568, 577, 579

[56] References Cited

U.S. PATENT DOCUMENTS

| | | | |
|---|---|---|---|
| 3,934,212 | 1/1976 | Javan et al. | 331/94.5 |
| 4,248,909 | 2/1981 | Whittaker | 427/586 |
| 4,302,933 | 12/1981 | Smith | 60/261 |
| 4,537,791 | 8/1985 | Tarjan | 427/586 |
| 4,629,859 | 12/1986 | Reddy | 219/121 |
| 4,892,751 | 1/1990 | Miyake et al. | 427/586 |
| 4,972,061 | 11/1990 | Duley et al. | 219/121.66 |
| 4,981,717 | 1/1991 | Thaler | 427/572 |
| 5,012,482 | 4/1991 | Gray | 372/74 |
| 5,080,753 | 1/1992 | Doll et al. | 427/586 |
| 5,096,739 | 3/1992 | Strutt et al. | 427/584 |
| 5,098,737 | 3/1992 | Collins et al. | 427/596 |
| 5,149,406 | 9/1992 | Mullens et al. | 204/157.22 |
| 5,154,945 | 10/1992 | Baldwin et al. | 427/596 |
| 5,168,097 | 12/1992 | Araya et al. | 427/596 |
| 5,254,832 | 10/1993 | Gartner et al. | 427/596 |

Primary Examiner—Marianne Padgett
Attorney, Agent, or Firm—Pillsbury Madison & Sutro LLP

[57] ABSTRACT

Laser energy is used to make precursors of crystalline materials, such as diamond, by providing an environment in which optical radiation may be efficiently absorbed to create significant precursor concentrations. In some instances this process is augmented by evaporating or liquefying a sacrifice to induce heterogeneous nucleation. In other cases two chemically and spatially distinct plasmas are juxtaposed to initiate the required chemistry.

26 Claims, 9 Drawing Sheets

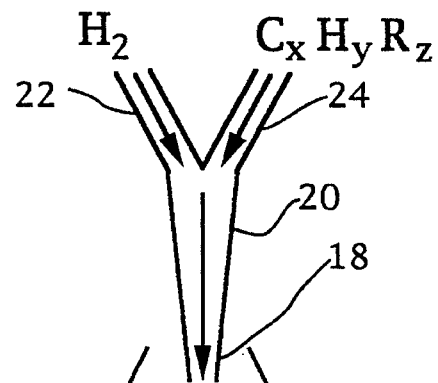
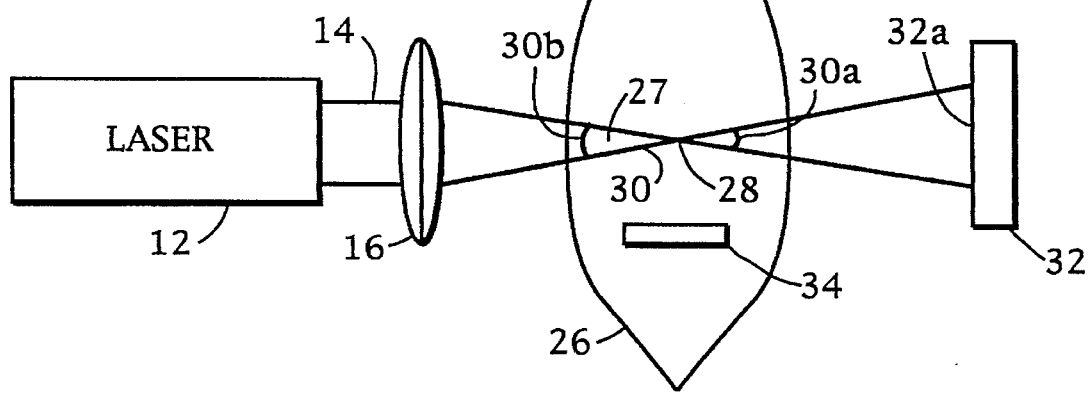
FIGURE 1
FIGURE 2

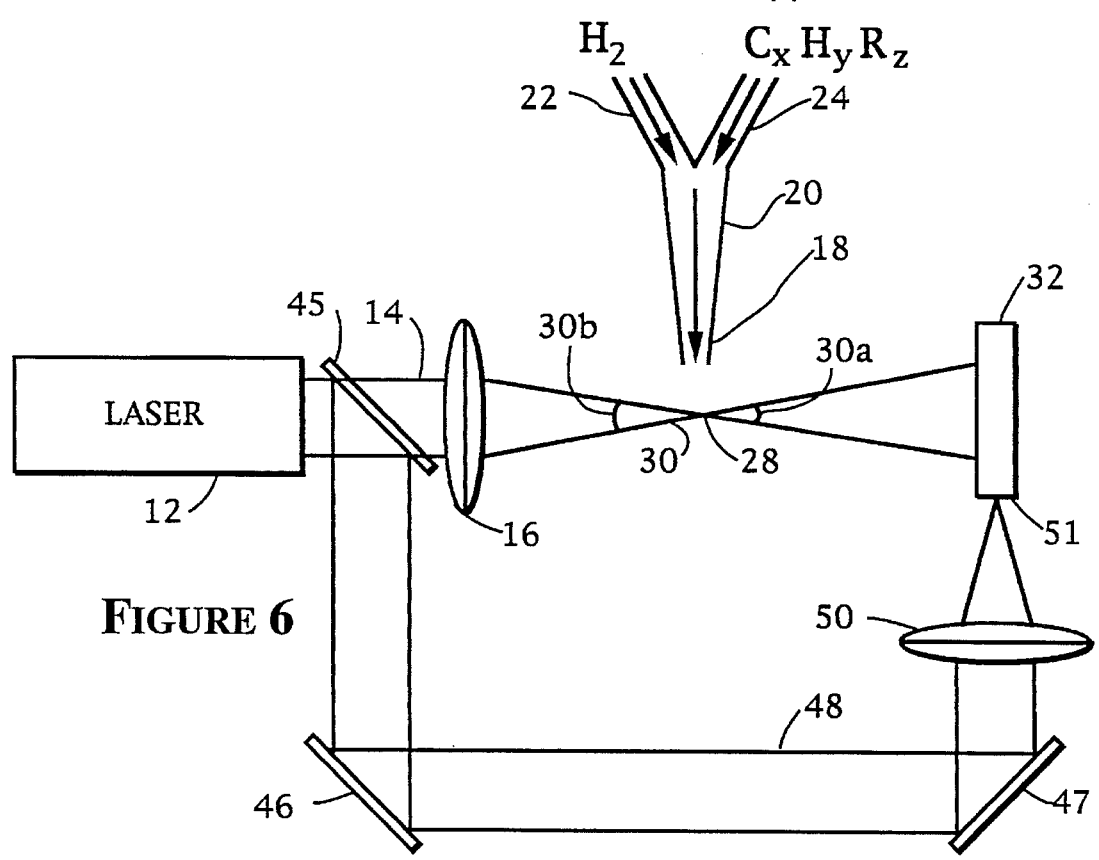

LASER ABSORPTION WAVE DEPOSITION PROCESS AND APPARATUS

This application is a continuation-in-part of application U.S. Ser. No. 08/062,202, filed 17 May 1993, now abandon.

BACKGROUND OF THE INVENTION

Hard coatings such as diamond, diamond composite, cubic boron nitride and carbon nitride are in great demand as protective coatings for a number of materials, and as hardness coatings on various machine tools. Diamond coatings are in demand as electronic materials, owing largely to qualities of high thermal conductivity, electron mobility, and radiation resistance. Furthermore, diamond also finds application as a cold cathode material due to its high, negative electron affinity. Such cold cathode applications will make possible flat panel displays. Diamond also has been identified as an excellent drug delivery system candidate due to its chemical inertness, lack of biodegradation, and the ease that various organic molecules have in reversibly binding to its surface.

Because of the great demand, techniques have been developed to apply diamond coatings to a wide variety of materials. Common to most of the production techniques is the formation of a plasma as a source of atomic hydrogen and carbon diamond precursors. Conventional chemical vapor deposition methods require substrate heating to temperatures between 800° to 1000° C., as well as low gas pressures to tens of torr to assure the transformation of carbon precursors from the plasma to a diamond phase on a target substrate. In the flame techniques pioneered by Hirose where diamond growth takes place at atmospheric pressure, target substrates tend to over heat unless actively cooled. In a third case, pressures of tens of thousands of atmospheres and temperatures of thousands of degrees are used to create diamond within molten acetylide salts. Anthony et al., U.S. Pat. Nos. 5,110,579 and 5,273,731, show polycrystaline free standing diamond film and methods of manufacture that include the use of a hot (2000° C.) tungsten filament in a 1 to 50 torr environment of 2% methane and 98% hydrogen to very slowly (16 microns/day) deposit diamond on an 800° C. substrate 7 mm from the filament.

In U.S. Pat. No. 4,981,717 by Stephen Thaler, there is disclosed a method of creating and depositing diamond coatings on a substrate at atmospheric pressure that does not require substrate cooling. The Thaler method is to generate a plasma by absorption of intense impulse of laser radiation into a precursor gas or a gas mixture at atmospheric pressure. The laser impulse is absorbed by an initiator gas, which is mixed in with hydrocarbon precursor gases such as, methane, ethane, propane, ethylene, or acetylene. The initiator is preferably a compound which is strongly absorbing at the output wavelength of the laser. A shock wave, associated with the sudden absorption of laser radiation, is utilized to transport ions, radicals, and molecular fragments onto a suitably positioned substrate so quickly that a diamond like coating is formed. Usually, diamond like coatings are formed of a carbonaceous species having characteristics, hardness and chemical structure similar to diamond.

However there has been a need for a process that rapidly deposits and perhaps welds diamond and other ultrahard on a substrate, or creates diamond or diamond metal composite abrasive particles, or can be used to create diamond patterns on boarings and the like.

SUMMARY OF THE INVENTION

There is provided by this invention a general pulsed laser method for forming film coatings from a gas phase. A seed plasma is created in the gas via an intense, focused laser pulse. Subsequent energy from the laser pulse is absorbed within this seed plasma to form a plasma excitation called a laser absorption wave. The laser absorption wave is a wall of energy that detaches from the seed plasma and propagates through the gas. The resulting LAW may then be used in one of three possible modes. In the first, the extreme temperatures pressures, and fluxes encountered within the ionization-shock front may be sued to drive the formation of diamond and other ultra-hard materials on substrates placed directly within the laser irradiance. In the second mode of operation, the volume swept out by the LAW contains a highly enriched region of activated CVD species, which may now diffuse to a properly preconditioned substrate held in close proximity. In the third mode of operation, two physically and chemically distinct plasmas, one originating from the LAW and the other from laser ablation of a solid substrate, are physically nested to produce new compounds and phases.

BRIEF DESCRIPTION OF THE DRAWINGS

FIG. 1 is a schematic diagram of apparatus for performing the laser deposition process incorporating the principles of the inventions herein;

FIG. 2 is an alternate embodiment of the schematic diagram shown in FIG. 1 having a substrate reflective of the laser beam;

FIG. 5 is an alternate embodiment of the ablation process shown in FIG. 4;

FIG. 6 is a schematic embodiment of the laser deposition process illustrating laser heating of the substrate;

DETAILED DESCRIPTION OF THE PREFERRED EMBODIMENT

Figure 1A:
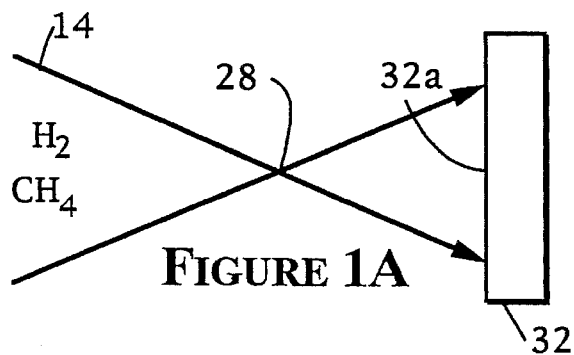
FIG. 1A is a detail view of the laser beam focus shown in FIG. 1.

There is shown in FIG. 1 the laser absorption wave apparatus 10 that is generally comprised of a pulse laser 12 that emits a laser pulse 14 that is focused by a lens 16 into a gas stream emitting from the nozzle 18. The gases emitted from the nozzle 18 are combined in a gas line 20 that is supplied by gases from a hydrogen input 22 and a hydrocarbon gas input 24. The hydrocarbon gas may be any gas containing the fragment having the chemical formula $C_xH_yR_z$ where R is any other atom or not present at all. The process may be performed in either an oxygen or oxygenless atmosphere. When performed in the presence of $O_2$, the irradiation of the gas by the laser 12 ignites the gasses and atmospheric $O_2$ into a flame 26. The flame 26 can be used as a substrate heater. When the process herein described is performed in a closed chamber filled with an oxygenless atmosphere, the flame 26 does not exist so substrate heating is usually accomplished by direct laser irradiation.

Figure 1B:
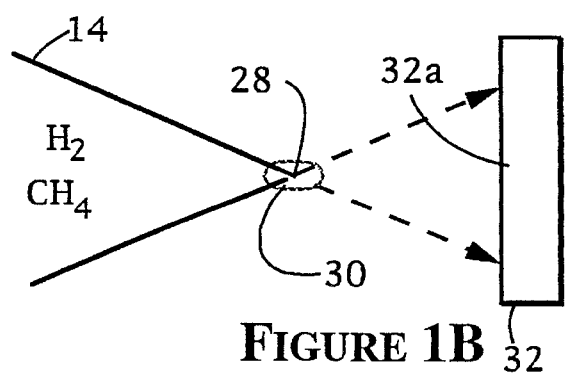
FIG. 1B is a detail view of a laser spark of plasma at the laser beam focus shown about ~3 nsec after the laser beam of FIG. 1A is created.
Figures 1C, 1D:
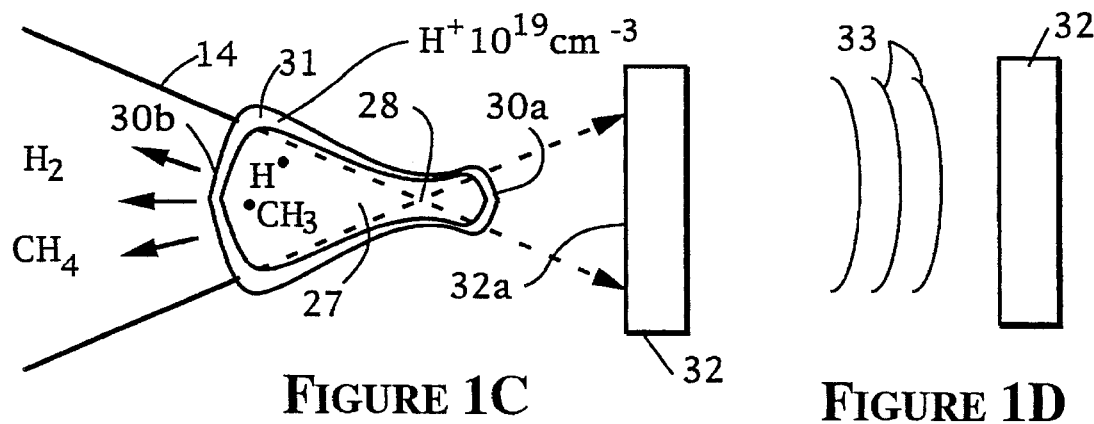
FIG. 1C is a detail view of the plasma laser absorption wave about the laser beam focus shown about ~6 nsec after the in the condition of FIG. 1B.
FIG. 1D is a detail view of the pressure waves that remain about 10 nsec after the time of FIG. 1C.
Figure 1E:
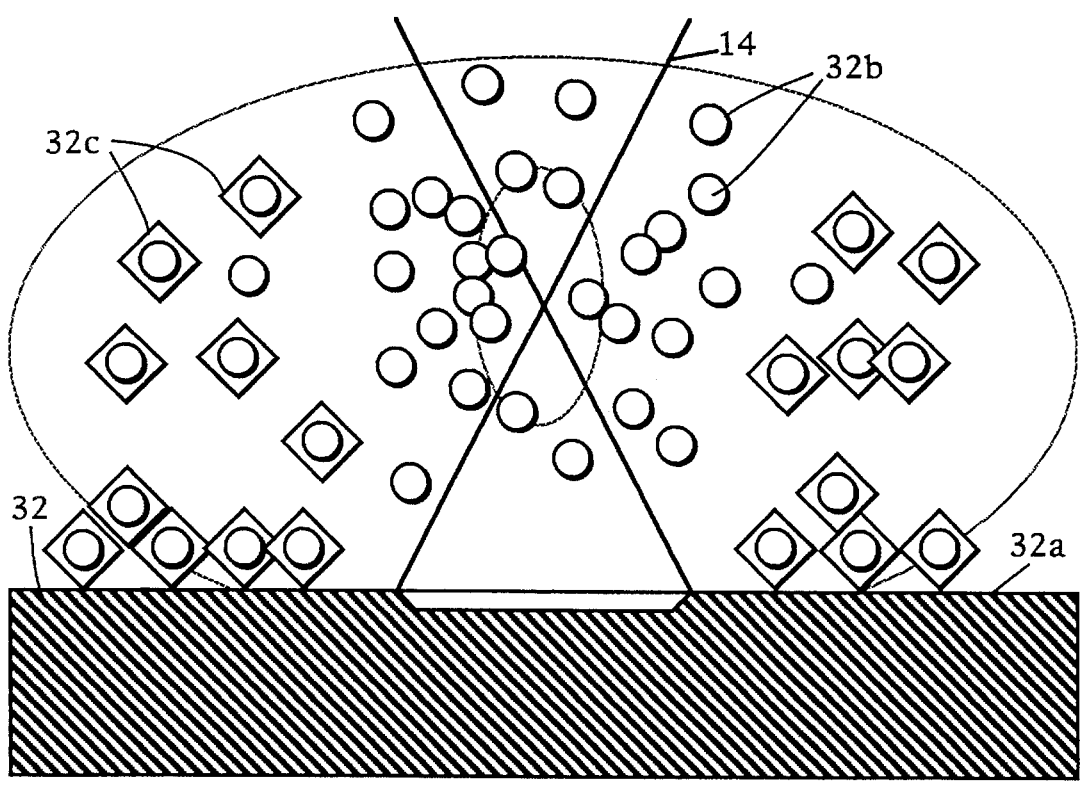
FIG. 1E is a greatly enlarged view showing diamond/substrate composite being formed.

Above threshold levels for avalanche breakdown, the laser pulse 14 creates a plasma 27 with its seed at the focal point 28 of the laser pulse 14 (FIG. 1A and 1B). Further excitation by the laser 12 creates a laser absorption wave (LAW) generally shown at 30. The energy of the pulse of the laser 12 is adjusted to deliver additional energy to the plasma 27 beyond the threshold level for avalanche breakdown. Gas behind the plasma 27 at 30a is cut off from further excitation by the laser 12, because newly formed plasma at 30b absorbs most of the incident laser energy (FIG. 1C). As shown in FIGS. 1A, 1B, 1C, and 1D, this absorbed energy is converted to an ionization shock wave 31, ionizing successive layers of gas, which in turn optically absorb. Not only does additional energy from the laser beam 14 contribute to the LAW, soft X-rays from the ionized material, ˙CH3 and H˙ there behind, also contribute energy, hence the minor portion of the LAW 30a also continues to propagate toward the substrate 32. The process cascades and the ionization shock wave builds propagating back toward the laser 12. The minor LAW shown at 30a propagates away from the laser 12. As both major and minor LAWs counterpropagate within the optical channel, they produce a "bottle" of dissociated hydrogen gas (i.e. H˙) and carbon precursors to diamond. As this "bottle" now expands toward the substrate, it produces all the required diamond growth species directly at the gas-solid interface in unprecedented concentrations. In this way, such species need not diffuse from a spatially separated plasma. Furthermore, the transient temperature and pressure excursions, reminiscent of geothermal conditions and produced by either LAW shock fronts may transform any graphitic carbon forming substrate 32a into diamond and other hard carbon phases.

At high levels of energy output from the laser 12, the surface 32a of the substrate 32 will evaporate, forming a gas or vapor supplementing the absorption wave 30. The vaporized substrate recondenses into microparticles 32b that cool further causing the diamond precursors generated by the laser absorption wave 30a to coat them with diamond. The coated microparticles 32c travel back to the substrate 32 to form a diamond film thereon or on substrates 34 in close proximity when the temperature and chemical ratios are correct. Mid levels of laser energy applied to the substrate 32 create a spray of liquid or heated substrate material particles that act as nucleation centers for accumulating materials generated in the laser absorption wave 30. When the substrate 32 contains metal, diamond tends to grow about the metallic particles, which are transported back to the substrate 32 to form a diamond metallic composite surface. At lower energy levels, the surface 32a of the substrate 32 is liquefied. The materials created in the absorption wave 30, normally a diamond or diamond like film that results from breakdown of the hydrocarbon gas $C_xH_yR_z$ in the gas mixture of $C_xH_yR_z$ and $H_2$, travel back to the surface 32a and become welded thereto.

There is shown in FIG. 2 an alternate method of coating a substrate 32 with a diamond film using the laser absorption wave technique. In this embodiment, the original surface 35 of the substrate 32 is reflective. The laser pulses 14 from the laser 12 are focused beyond the substrate surface 35 such that reflected pulses 36 initiate the laser absorption wave 30. In this configuration, energy from the laser pulses 14 is used partially to preheat the surface 35 of the substrate 32 to about 1000° C. and the laser absorption wave 30 is created with the balance of the energy such that the major portion 30b of the wave 30 propagates toward the substrate 32 with diamond precursors (methyl radicals and hydrogen ions) at over 2000° C. This alternate method enhances adhesion of the diamond composite to the substrate 32.

Figure 3:
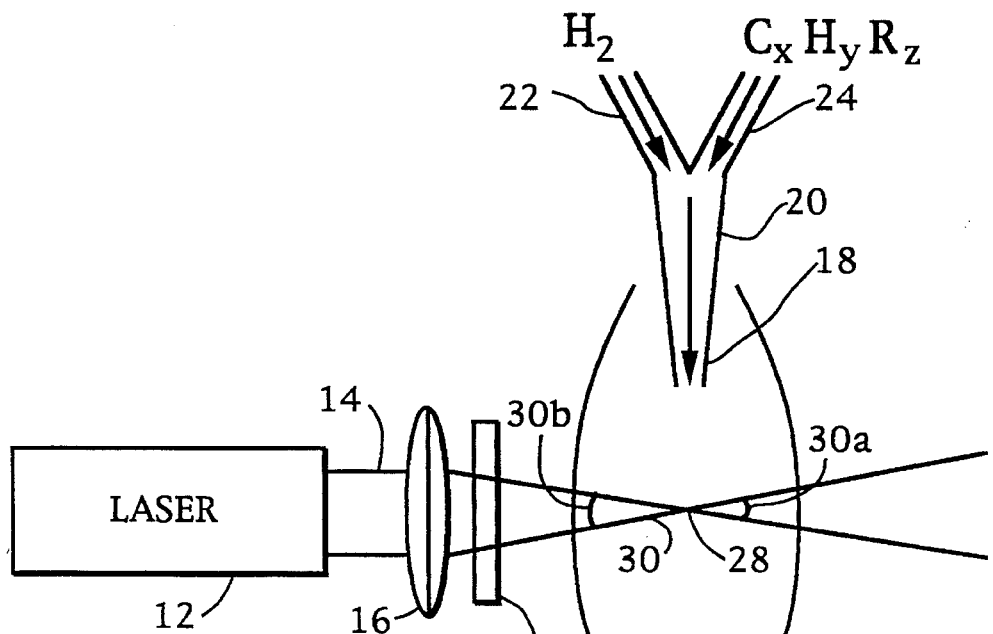
FIG. 3 is a schematic diagram of apparatus for the laser deposition process having a substrate transmissive to the laser beam.

Another embodiment is shown in FIG. 3 that incorporates the principle of using a laser absorption wave 30 to deposit diamond on a transmissive substrate 38. In this configuration, the transmissive substrate 38 is inserted between the laser 12 and the laser absorption wave 30. Once the laser absorption wave 30 is initiated, the major portion of the laser absorption wave 30b, travels in the direction of the substrate 38 and coats the substrate 38. It should be appreciated that in all of the embodiments shown, both composition and phase of the deposit on the substrate may be changed by variation of the process parameters such as the focal standoff, the distance between the focal point of the laser 12 and the substrate, the laser pulse energy, the laser pulse repetition rate; and the flow rates of the gases. The following table lists examples of process parameters for various substrates optimized for producing diamond:

| Substrate | z (mm) | $E_L$(mJ) | $f_{H_2}$ | $f_{CH_4}$ | $T_s$ | cell |
| --- | --- | --- | --- | --- | --- | --- |
| tungsten carbide | −12 | 100 | 15 | 0.04 | 800° | Open |
| 440C steel | 0 | 300 | 15 | 0.04 | 800° | Open |
| 440C steel | +22 | 75 | 30 | 0.04 | 30° | Closed |
| graphite (POCO) | 0 | 100 | 27 | 0.04 | 30° | Closed |
| aluminum (2024) | +15 | 300 | 17 | 0.20 | 30° | Closed |
| titanium (Ti-6-Al-4V) | +20 | 75 | 12 | 0.04 | 30° | Closed |
| silicon | −10 | 150 | 12 | 0.04 | 30° | Closed |

In the table above; z=the standoff distance in millimeters where positive standoff is shown in FIG. 1 and negative standoff is shown in FIG. 2; $E_L$=the laser pulse energy in millijoules; $f_{H_2}$=flow rate of hydrogen in liters per minute; $f_{CH_4}$=flow rate of methane in liters per minute; $T_s$=bulk substrate temperature in degrees centigrade; and cell indicates whether the process was conducted in open air with flame or closed chamber without flame. All of the examples were performed with a YAG laser, Q-switched at 1.06 μm, having a 10 nsec. spike, at a repetition rate =20 Hz. The lens was a f4 focusing lens with a 6" focal length.

Figure 4:
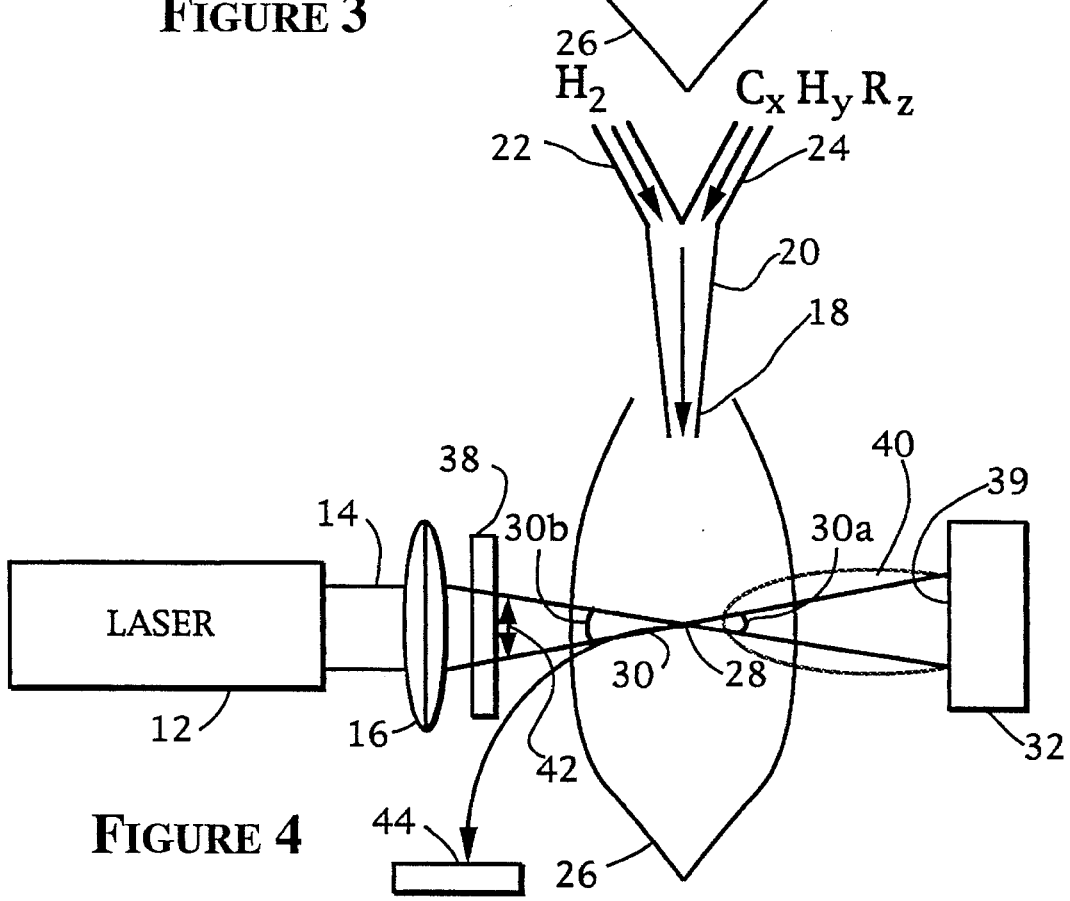
FIG. 4 is a schematic embodiment of the laser deposition process illustrating substrate ablation.

FIG. 4 illustrates another embodiment where the pulses 14 of the laser 12 are focused by the lens 16 onto the substrate 32 such that a target area 39 of the substrate 32 liquefies or evaporates to produce an atomized spray 40 of liquid or solid seed. Under conditions of where the temperature of individual nuclei is approximately 800°–1200° C., the spray 40 seed is injected into the laser absorption wave 30, which is simultaneously created. When the substrate 32 is graphite or a high carbon content material, the spray 40 provides carbon seeds that are coated by the laser absorption wave 30 in a homogeneous nucleation scheme to produce diamond. Material consolidation forms a diamond film on the substrate 32 with pieces of graphite therein. Later laser pulses 14 are strongly absorbed by the graphite, which tends to evaporate out of the diamond film as it is formed. Further, material arriving within the beam path 42 and consolidating on the transmissive substrate 38 may be used to create an optical coating. Spray nuclei with sufficient momentum to traverse the laser absorption wave 30 through the optical path 42 can create separate particles for use as grit or polishing powder, which may be collected on substrate 44 positioned far enough away that the separate particles are too cool to weld thereto or be deformed thereby.

If the substrate material 32 is a metal, the spray 40 then provides solid or liquid metal nuclei that seed the laser absorption wave 30. In this instance the metal condensates are coated with diamond structure. The resulting coated particles may then reconsolidate on a substrate such as 32 to produce a metal diamond composite coating. Such a process is facilitated if the metal is still liquid and hence mobile when it is transported to the substrate 32. Metal nuclei escaping through the laser absorption wave 30 may be coated with diamond to create distinct particles of diamond coated metal. Should such conglomerate particles cool before capture on a substrate 44, perfectly spherical abrasive or bearing particles may be formed. If arriving particles still possess liquid cores, the molten metal serves to weld a diamond metal composite to the substrate 44.

Another embodiment, where the laser pulses 14 are focused directly on the substrate 32 creating the spray 40, is shown in FIG. 5. The precursive gases of the hydrogen and hydrocarbon mixture are also supplied at the focal point 28 by the nozzle 18 such that the laser absorption wave 30 is created at the surface 35 of the substrate 32. This further enhances seeding of the laser absorption wave 30 for developing a diamond like film.

Figure 7:
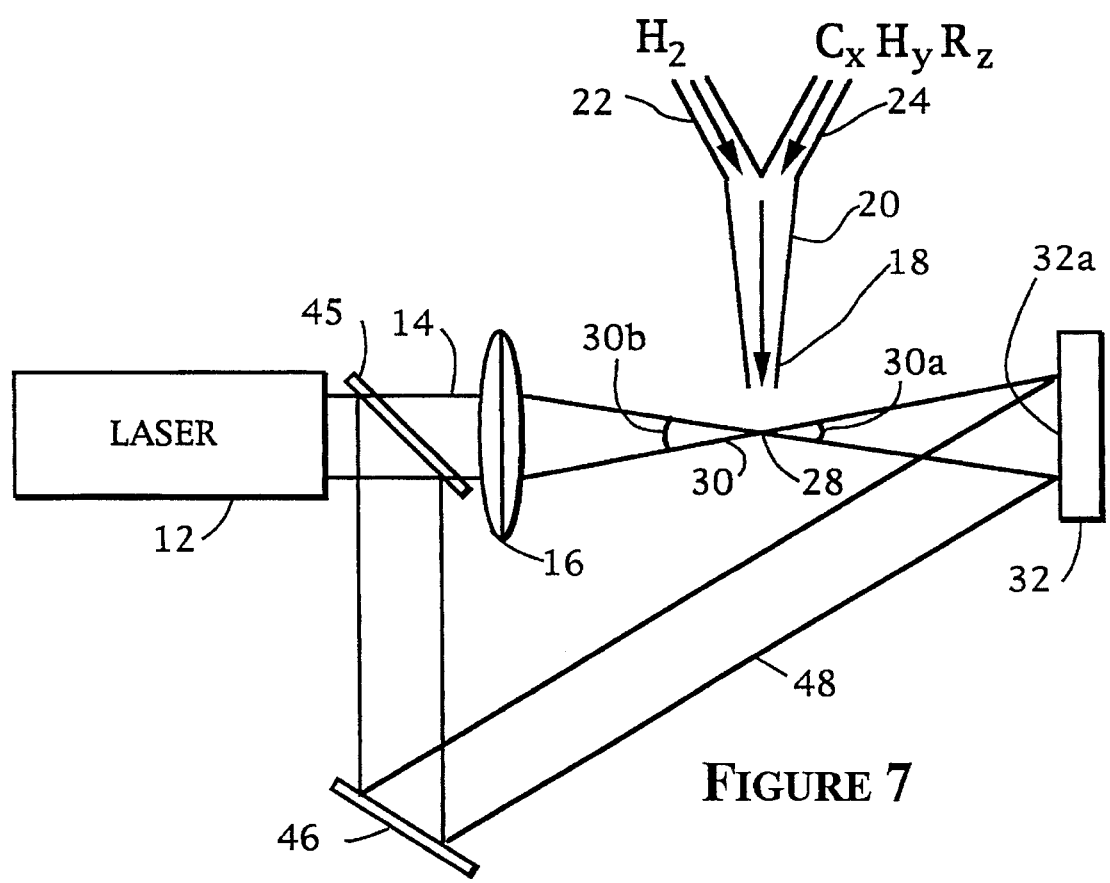
FIG. 7 is a schematic embodiment at a modified version of the process of FIG. 6.

FIG. 6 illustrates an alternate embodiment wherein the laser absorption wave apparatus 10 is modified to incorporate a light splitter 45 and mirrors 46 and 47 that divide a portion of the laser pulses 14 and direct it along a separate optical path 48, such that the separate pulse portions are focused by lens 50 upon the substrate 32 to preheat it. This configuration, wherein part of the laser output pulses are split off to preheat the substrate 32, can be utilized in all of the embodiments herein above shown and described. In FIG. 6, the laser pulses are shown directed at the edge 51 of the substrate 32 to heat it in bulk. As shown in FIG. 7, a single mirror 46 can be angled to recombine the laser energy in the path 48 with the focused portion at the surface 32a of the substrate 32 to raise just the surface temperature. The amount of energy bypassed in this manner can be controlled by adjusting the reflective qualities of the light splitter 45.

Figure 8:
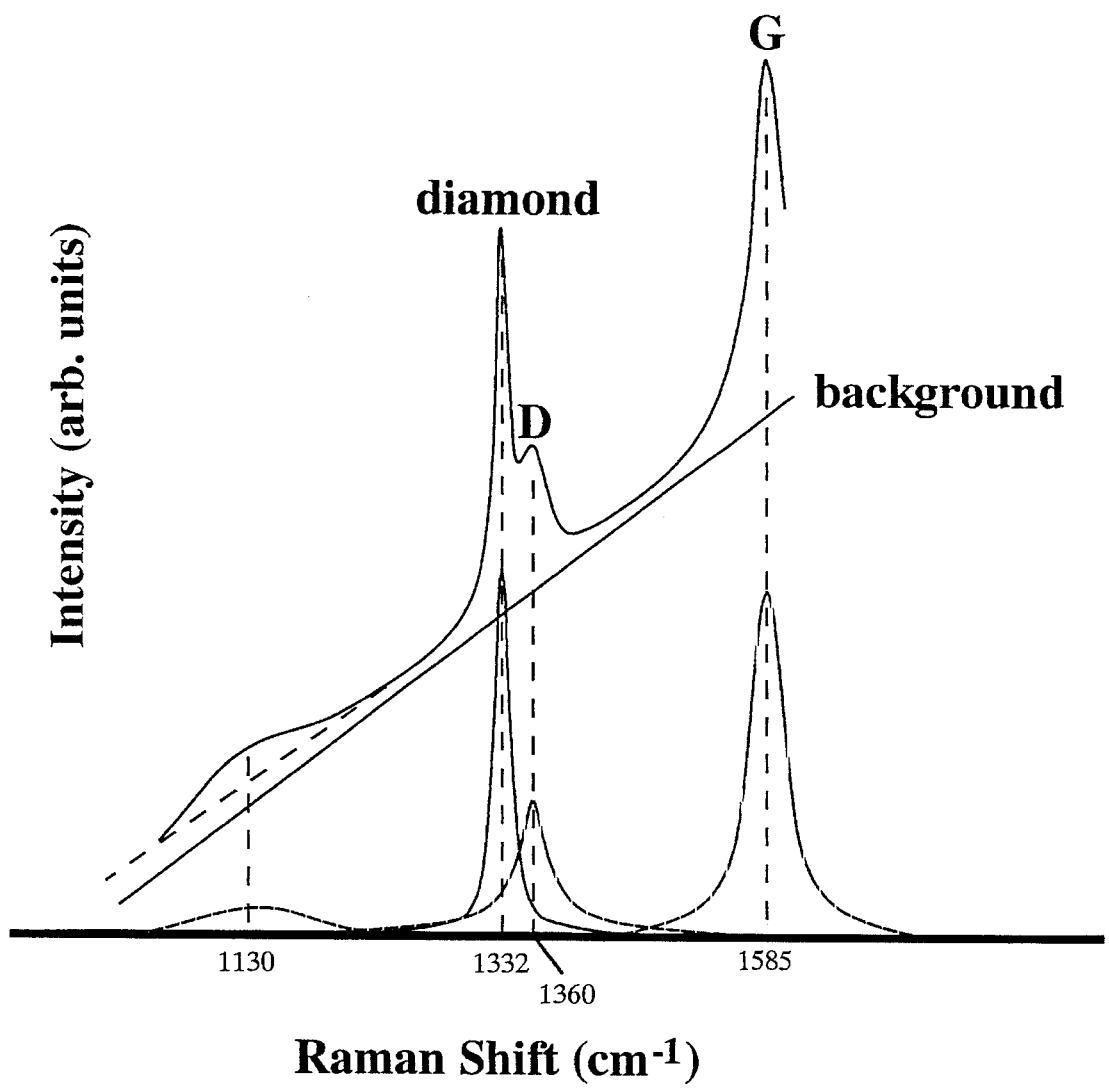
FIG. 8 is a Raman spectrum of the various carbon forms created by the present process.

The present process can be used to manufacture various diamond and diamond like structures. FIG. 8 is a composite Raman spectrum of various diamond phases that have been grown. The solid line is the normal spectrum for diamond with its characteristic spike at 1332 cm$^{-1}$. Nanodiamond, that is diamond crystals that are too small to show the typical diamond spectra, have been found by their characteristic hump at about 1130 cm$^{-1}$ shown in dashed line. Disordered graphite or diamond like material having an elevated hump at 1360 cm$^{-1}$ and a gradual hump between 1360 and the characteristic graphite hump at 1585 cm$^{-1}$ is also shown. In general, pure nanophase diamond, displaying only the broad Raman feature near 1130 cm$^{-1}$, may be created on substrates held below 800° C. Creation of such nanometer grain material may be the result of rapid quenching of the relatively cool substrate surface or by rapid freezing on heterogeneous nuclei originating in the ablation plume. Diamond crystallites of micron size dimensions or higher generally may be formed on substrates held near 1000° C. or by the high pressure and temperature excursions produced by the LAW shock wave. Highly disordered graphite phases may be produced by extended dwelling of the laser pulse train on graphite targets immersed in hydrogen hydrocarbon atmospheres. Such materials (with $[I_D/I_G]$ ratios approaching 2) may possess 80–90% of the hardness of diamond.

The present process can be used to deposit other films such as $SiO_2$, using $O_2$ as the gas and Si as a sacrificial substrate; $Si_3N_4$, using $N_2$ as the gas and Si as the sacrificial substrate; amorphic carbon, using carbon vapor as the gas and graphite as the sacrificial substrate; and cubic boron nitride and/or hexagonal boron nitride, using $N_2$ as the gas and hexagonal boron nitride as the sacrificial substrate.

The present invention can be used to produce diamond growing techniques that generate the required growth species directly adjacent to the substrate 58 to be coated with a layer of diamond 60 (see FIGS. 9, 10 and [11)]. Heretofore, the required species, atomic hydrogen, methyl radicals, and acetylene have been created in a plasma 62 about a hot (≧2000° C.) wire 64, at a location spatially separated from the receiving substrate 58 heated to about 1000° C. As a result, the diamond growth species must migrate by diffusion across a gap 66 of between millimeters to centimeters to reach the thermally prepared substrate 58. Much of the diamond growth material is lost by recombination or chemical reaction during transport to the substrate 58. Furthermore, diffusion barriers may develop, greatly reducing the flux of diamond growth material at the substrate's surface 68. It is also desired to grow thin films of diamond on various substrate materials which cannot withstand bulk heating to the vicinity of 1000° C. Probably the best exemplary materials are steel alloys, which are driven through softening phase transitions at this temperature range, but whose successful coating with diamond or metal diamond composites, rapidly and adherently, opens a world market coating infrastructure for corrosion resistance, hardness, and lubricity.

Figures 10, 11:
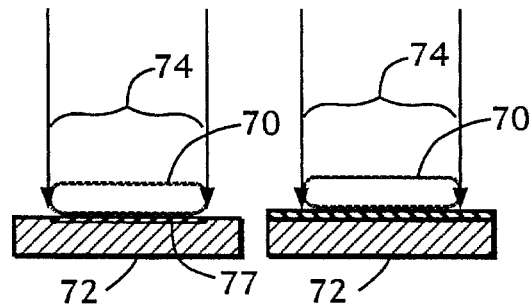
FIG. 10 is a schematic diagram of a similar process to that of FIG. 9 using the principles of the present inventor to eliminate the hot filament.
FIG. 11 is a schematic diagram of the process of FIG. 10 later in time.
Figure 12:
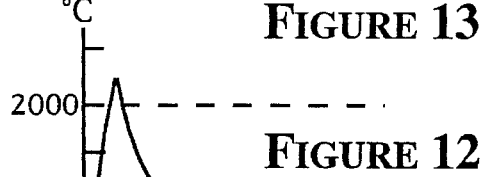
FIG. 12 is a graph of surface temperature vs. time for the present diamond deposition process
Figures 16, 17:
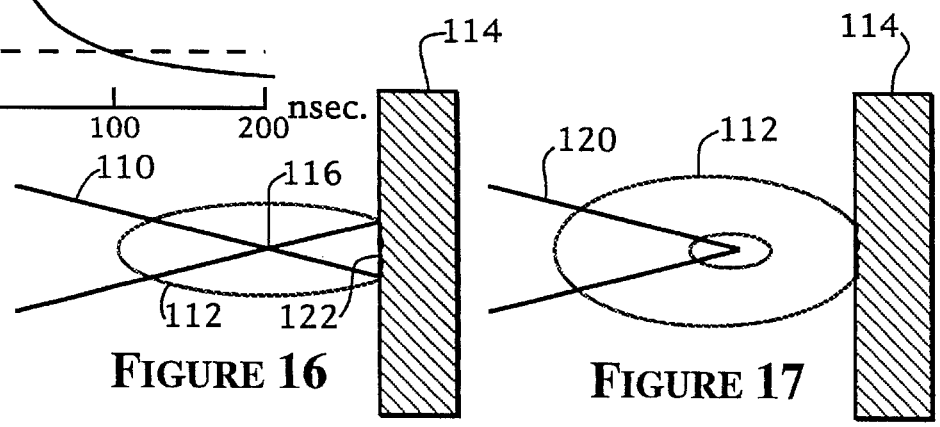
FIG. 16, 17, 18 and 19 are diagrams of a modified process similar to that of FIG. 13 at different times during the process with FIGS. 17 and 18 showing ultimate way to apply sustaining laser energy.
Figure 18:
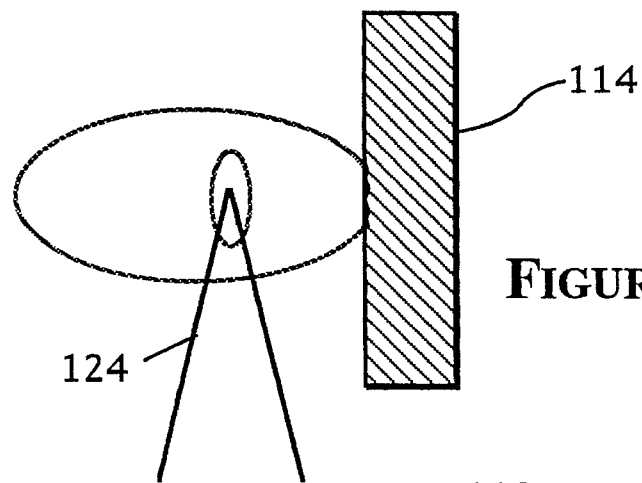
Figure 19:
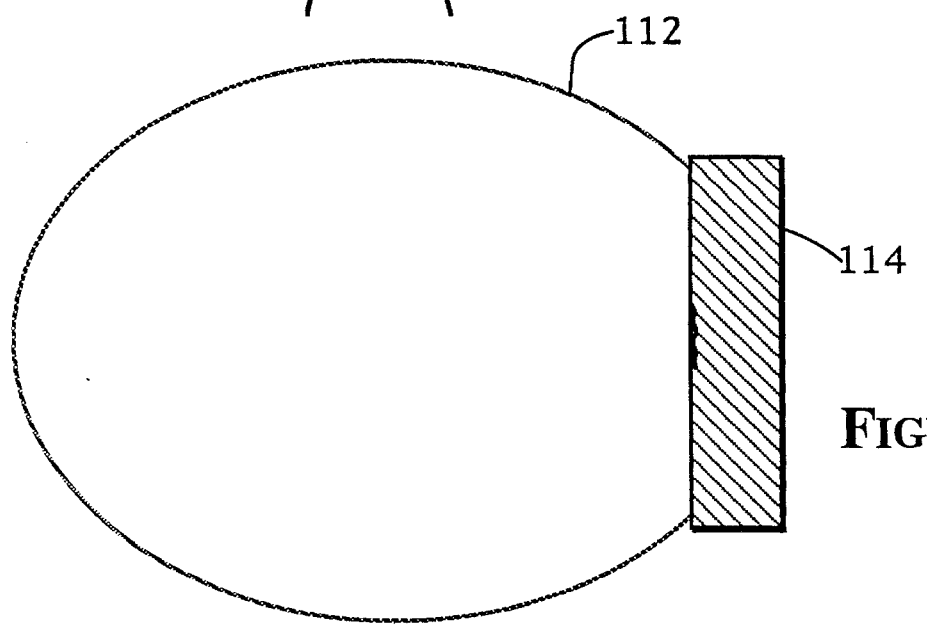

As shown in FIGS. 10 and 11, precursor species to diamond growth can be produced within a thin laminar sheath 70 directly in contact with the substrate 72 to be coated. Therefore, the need for diffusion of carbon species over long distances is obviated. Methyl radicals, $\cdot CH_3$, usually react in transit from plasma region to substrate, forming the less desired species, acetylene. Here, they are manufactured in high concentration in the thin sheath 70 of microns thickness, directly over the receiving substrate 72. Further, the process cannot be hindered by the formation of diffusion barriers. The receiving substrate 72 need not be heated to bulk temperatures of 1000° C. (Instead, the substrate 72 may be at room temperature, undergoing only the transient surface heating (shown by solid line in FIG. 12) that results from 10$^9$ watt, 10 nsec pulses 74, which penetrates only a few microns into the substrate material. Such pulses applied to a carbon substrate 72 boil off carbon atoms that act as absorbers of the photon energy cutting off the energy to the surface and producing a high plasma density of diamond precursors (H˙ and ˙CH₃)

The process may be carried out at atmospheric pressure, eliminating the need for vacuum chambers. Since growth species are manufactured directly in contact with the surface 76 of the substrate, there is no need to supply a large mean free path for growth species by evacuation. In fact, in this process, the higher the pressure (and hence the greater the precursor concentrations) the faster the diamond deposition rate.

As a result of generating so much carbon in the vicinity of the substrate surface 76, the needed carbon saturation of that surface, prior to any diamond accumulation ('induction'), is greatly accelerated. Instantaneous melting of the substrate 72 may even further accelerate the inward diffusion and carbon quenching of the surface layer.

Figure 9:
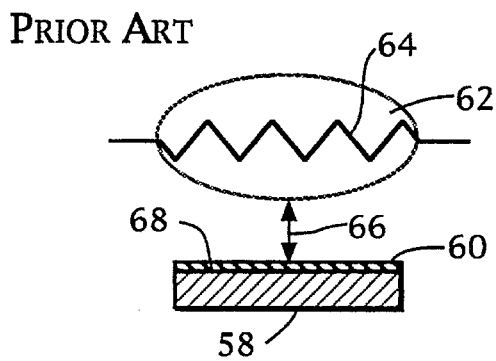
FIG. 9 is a schematic diagram of a prior art hot filament diamond deposition process.

Comparing FIGS. 9, and 10 and 11, the prior art (spatial) hot filament process is contrasted with the present "temporal" hot filament (THF) process chemical vapor deposition (CVD). In normal hot filament CVD reactors, the plasma 62 producing diamond precursors is generated by the ohmically heated, metal filament 64 made from materials such as tungsten or tantalum. The filament 64 must attain temperatures in excess of 2000° C. to break down gas mixtures of hydrocarbons and molecular hydrogen into methyl radicals and atomic hydrogen. As described above, these carbon precursors to diamond must then diffuse to the substrate 58 preheated to somewhere between 800° and 1100° C.

In distinct contrast to the spatial hot filament process, the process illustrated in FIGS. 10 and 11 uses the receiving substrate 72 to both pyrolyze the ambient CVD gas mixture into the diamond precursors as well as serving as a receiving substrate. This is achieved by separating these events in time, supplying either a laser pulse 74 or transient electrical discharge to the substrate area targeted for deposition. Initially, the heated zone 77 spikes to over 2000° C., rapidly dissociating a thin sheet of CVD plasma (from a hydrogen-hydrocarbon gas mixture) directly adjacent to it. As this same transiently heated zone 77 cools to the temperature regime between 800° to 1100° C., methyl radicals (and perhaps acetylene molecules) condense onto that zone and are stabilized into diamond phase by the prevalent atomic hydrogen.

When laser pulses 74 of short duration are used, such do not graphitize newly deposited diamond. The deposited diamond has a very high thermal conductivity, so heat is quickly transferred to the gas phase in direct contact with it. Further, since the diamond is transparent to the pulsed laser sources used, optical energy is not shunted away from the underlying substrate by absorptive mechanisms.

Typical deposition parameters are as follows:

1.06 micron, Q switched YAG non focused laser, 10 nsec pulse width, pulse energy=50 mJ, pulse repetition rate= 20 Hz;

total background pressure=1 atmosphere; and methane/hydrogen ratio=0.01 to 0.30.

Alternately, in lieu of a pulsed laser source, an electrical discharge may be used to affect similar results. In preliminary proof-of-principle experiments, a simple neon sign transformer was used to produce arcing at the cutting edges of cemented carbide lathe inserts, selectively producing metal-diamond composite deposits on these edges. Similar gas flows were used.

Such processes allow steel alloys to be diamond coated owing to the low bulk temperatures involved and the fast induction times. Direct application of diamond and diamond-like materials onto various substrate materials may be attained due to the selective deposition afforded by the laser, and direct application may be used to selectively harden cutting surfaces on both high speed steel and cemented tungsten carbide tools. The technique can be generalized to create other superhard materials such as cubic boron nitride, carbon nitride, and silicon nitride. These directly applied layers can be formed on boron, carbon, or silicon substrates held within molecular nitrogen environments. The THF CVD processes may be carried out on various substrates to produce nucleation layers for diamond growth via existing art. Preliminary experiments have shown that THF CVD films are excellent seed layers for normal hot filament reactors. Essentially, small seed crystals embedded within a metal, project far enough out of the composite's surface to "see" the new growth environment. Such a high nucleation density assures growth at many times the rate attained by a normal hot filament reactor. Further, because of very secure anchoring in the metal matrix, the resulting film layer is exceedingly adherent.

The formation of a thin plasma sheath generating carbon precursors for diamond growth, in direct juxtaposition to the substrate to be coated is a highly unique development in the field of diamond growth, and the notion of depositing diamond without significantly elevating bulk substrate temperature is a significant feature of this process. The point and deposit aspect of a highly directional and precise laser pulse allows equally precise control on where diamond is grown on a substrate. About 10 micron spatial resolution is possible using a 1.06 micron pulse YAG and submicron resolution is possible when shorter wavelength excimer lasers are used.

As has been discussed above, by initiating an avalanche breakdown in a CVD gas mixture at above 100 torr with a pulsed laser, very high growth rates of polycrystalline diamond can be attained, with significant adherence to a variety of substrate materials. The main problem barring operation of the same process at very low pressures (less than 100 torr to vacuum) is that laser energy cannot directly couple to the low density CVD gases involved to initiate the required avalanche breakdown. There simply is not enough material or electron density for the optical field to couple with. However a distinct advantage is gained by deposition at greatly reduced pressures because very smooth, homogeneous coating layers may be achieved over large surface areas and complex, non-line-of-sight topologies.

In hot-filament CVD techniques for depositing diamond discussed with respect to FIG. 9, a ribbon or filament of refractory metal such as tungsten is ohmically heated to approximately 2500° C. This temperature is sufficient to cause the dissociation of hydrogen gas and methane into atomic hydrogen and high-temperature hydrocarbons, such as acetylene and methyl radicals. These gas species then migrate by diffusion to a substrate preheated to temperatures between 600° and 1200° C., where carbon precipitates in the form of diamond. Drawbacks of this technique are: typically hours are required for the induction period to suitably carburize the filaments before they can produce the radicals; and the ionization produced is inefficient, as judged by the typically low growth rates observed for this technique of about 10 microns per hour.

Figure 13:
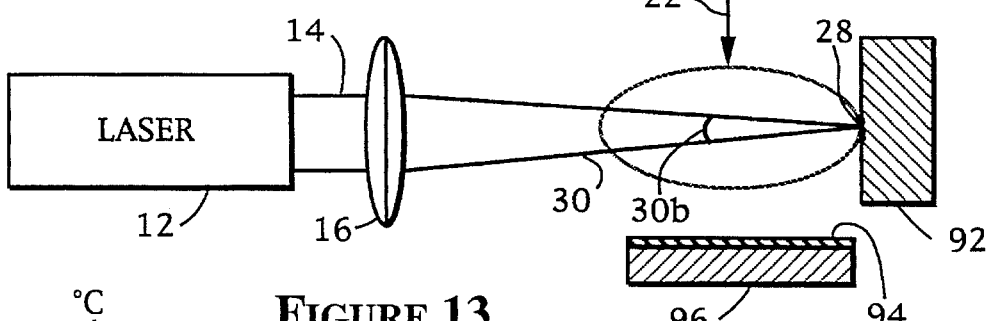
FIG. 13 is a schematic diagram of a sacrificial low pressure deposition process.

In the present laser plasma coupling chemical vapor deposition (LPCCVD) technique, an ablation plume produced by focused laser irradiation of a sacrifice 92 as shown in FIG. 13 is used to produce a stream of hot, microscopic atomic clusters or globules, which act as a transient, heated metal filament, having practically no carburization time, generally increased surface area and much higher activation rates of methane hydrogen mixtures (to form the necessary diamond-forming species). This condensing nanodroplet spray creates an extremely efficient filament for generating plasma species leading to diamond deposition 94 and an adjacent substrate 96.

Figure 14:
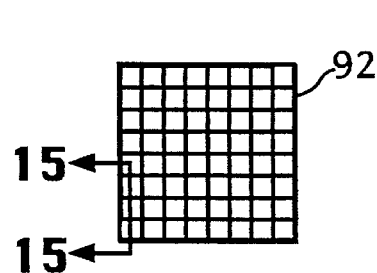
FIG. 14 is a top view of a bearing surface constructable with the process of FIG. 13.
Figure 15:
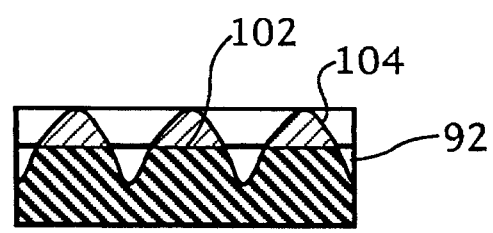
FIG. 15 is an enlarged cross-sectional view taken at line 15—15 of FIG. 14.

The technique described herein achieves avalanche breakdown conditions by focusing laser energy into the ablation plasma 90 formed within a very low pressure CVD gas background 98. High densities of transient ions and electrons in such ablation plume 90 efficiently absorb and then transfer laser energy from the beam 14 to the low pressure CVD gases with which it mingles. The energy transferred to the CVD gas mixture may then be used to activate its constituents, leading to the necessary dissociation or reactions necessary for physical or chemical vapor deposition. The approach qualifies as a laser plasma coupling technique, since energy exchange takes place between laser and the CVD gas mixture via the heated atomic clusters. By placing the focus point 28 of the beam 14 on or adjacent the sacrifice and then moving it the patterned structure 100 as shown in FIGS. 14 and 15 can be made. The focus point 28 is moved so some areas 102 are not sacrificed, resulting in diamond 104 depositing therein. Such structure have promise as bearings.

Since diamond is not absorptive of laser energy at 1.06 microns wave length, if a seed crystal of diamond is mounted on a graphite substrate in FIGS. 16–19, it will quickly grow. In crude tests a 0.2 carat diamond was increased in size by 30%. Since graphite absorbs 1.06 micron laser energy, any graphite structures that form on the diamond quickly vaporize, resulting in diamond growth without graphite flaws.

The LPCCVD process allows the creation of avalanche breakdowns in vacuum or low pressures, thus generating a highly efficient plasma source for CVD processes, including diamond growth. Electron densities and required reaction products are produced at densities higher than in any other known CVD plasma production technique. By virtue of working at low pressures, a very long mean free path can be achieved in a chamber and hence provide the ability to coat large objects uniformly and smoothly. LPCCVD eliminates the need for long filament induction periods in which carbon diffuses into and saturates the filament. In hot filament processes, carbon is largely diffusing into the filament during this time, depleting the necessary high-temperature carbon precursors to diamond by absorption into the filament. In LPCCVD, such carburization is rapid, owing to the high surface to volume ratio, and high temperatures and carbon mobilities achieved in the condensing nanodroplet spray. The small particulates rapidly saturate with carbon, now allowing the profuse generation of activated CVD species, in turn leading to diamond.

The transient or virtual filament created by the LPCCVD process allows the growth of diamond and other materials in gaseous atmospheres which would prove corrosive to the traditional metal filaments such as tungsten. For example, halogens such as chlorine and bromine may be added to conventional hydrogen-hydrocarbon mixtures to achieve diamond growth at greatly lowered substrate temperatures. Reaction with continuous metal filaments near 2500° C. would substantially decrease their lifetime, as well as possibly poison or contaminate the resulting film deposit. In addition, the LPCCVD process allows the simultaneous generation of diamond and brazing material in the form of molten metal spray. The result is a metal-diamond composite physically welded to various receiving substrates. Fine tuning of the LPCCVD process conceivably will allow the doping of diamond with atomic impurities, such as metal ions, leading to a much sought after n-type doping scheme in that material.

Details of the LPCCVD process are shown in FIGS. 16, 17, 18 AND 19, where the process is broken down into three distinct phases. In summary, the sequence of events involves the use of laser energy 110 to first initiate an ablation plasma 112 from a substrate 114. Note that the focused point 116 of the laser energy 110 may be substantially off the substrate 114. This ablation plasma is then used not only to absorb subsequent laser energy 120 and but also to transfer this same laser energy to the CVD gas mixture. CVD gases are thereby activated to produce the necessary growth species via the ablation plasma intermediary. Hot nanodroplet spray particles condensing from the ablation plume also convey activating energy to the CVD gas mixture. The ablation plasma material acts as an intermediary in the exchange of energy from the laser to the CVD gas mixture. Energy exchange takes the following route:

LASER→ABLATION PLASMA→CVD GASES.

This contrasts from a pure LAW process because in a similar LAW process, a laser absorption wave is generated by parallel transfer of energy to both CVD gases and ablation plasma:

LASER→CVD GASES LASER→ABLATION PLUME, leading to a mixture of activated CVD gases and ablation species.

Ordinarily, at low pressures, laser energy would not be directly transferred to the CVD mix to any great extent. The deliberate formation of the ablation plasma 112 in the midst of the CVD gases assures a very efficient transfer of laser energy 120, via three overlapping stages, as outlined below.

In the first stage (FIG. 16), a laser is focused just short of the ablation source material, (AS). As a result, a small area 122 of the ablation source 114 is vaporized into the plasma 112:

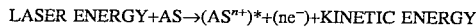
LASER ENERGY+AS→(AS$^{n+}$)*+(ne$^-$)+KINETIC ENERGY where * denotes the excited electronic state of the ablation species ions.

In the second stage of the process (FIG. 17), subsequent laser energy 120 within the same laser pulse, or alternately, energy 124 from a second laser source (FIG. 18) is focused into the newly formed and efficiently absorbing ablation plasma 112, thereby increasing energy in that ablation plume. This energy is now transferred by molecule-electron or molecule-ion collision to the low pressure CVD gas system.

(AS$^{n+}$)*+(ne$^-$)+KINETIC ENERGY+CVD→AS+CVD*.

The energetically activated CVD species (CVD*) then reacts or dissociates to form the necessary precursor materials for the deposition. The stream of aggregated AS material from the condensing ablation plume 112 then finds itself at an elevated temperature, equivalent to an ohmically heated metal. (In essence, the transient current of hot aggregates is equivalent to a hot-filament CVD scheme, as suggested in FIG. 19) It also converts CVD species to activated CVD species by cooling,

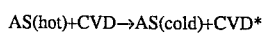
AS(hot)+CVD→AS(cold)+CVD*

For a diamond CVD growth scheme via homogeneous nucleation: AS=graphite; CVD=mixture of hydrogen and methane; and CVD*=atomic hydrogen, acetylene, and methyl radicals. For a diamond CVD growth scheme via heterogeneous nucleation: AS=metal such as chromium, tungsten, or aluminum; CVD=mixture of hydrogen and methane; and CVD*=atomic hydrogen, acetylene, and methyl radicals. For a cubic boron nitride growth scheme via homogeneous nucleation: AS=hexagonal boron nitride; CVD=nitrogen gas; and CVD*=atomic nitrogen. Note that the use of very high pulse repetition rates from the laser may produce a quasi-continuous supply of CVD plasma. (Note that electrical filaments, commonly run off of standard commercial power and operate at 60 Hz). At the present time, sources such as Q switched YAG laser routinely operate at 50 Hz.

To recap: the LPCCVD process provides a method for generating high electron density plasmas within CVD gases normally of too low a pressure to initiate an avalanche breakdown via laser or any other source; a method of forming a quasi-continuous stream of hot metal droplets, which act as a continuous metal filament, electrically heated; a method of supplying a filamentary heating elemental CVD gases which would normally be corrosive to a heated metallic element; and a method of incorporating impurities within a CVD or PVD deposit. These impurities would consist of moieties of the original ablation source. As in the laser absorption wave process, metal-diamond composites would be possible, In addition, because of the low pressures utilized, it is possible to incorporate individual dopant atoms into the resulting deposit.

Although there has been illustrated and described a specific structure, it is clearly understood that the same were merely for purposes of illustration and that changes and modifications may be readily made therein by those skilled in the art without departing from the spirit and scope of this invention.

I claim:

1. A method of coating a substrate material with a layer containing a first material comprising:

(a) providing a first gas in molecular form;

(b) irradiating the first gas and the substrate material with a pulse of energy from a laser to create at least a first plasma from the first gas wherein the molecules of the first gas are dissociated and ionized;

(c) cooling the at least first plasma into neutral precursors comprising atomic elements and radicals; and (d) transporting the neutral precursors to the substrate material to form the layer thereon.

2. The method of coating a substrate material as recited in claim 1 wherein step (b) includes:

(b1) focusing the pulse of energy into the first gas at a location spaced from the substrate material to form the at least first plasma into a laser absorption wave that travels back toward the laser to absorb the pulse of energy and to allow the at least first plasma between the laser absorption wave and the substrate to cool to atomic elements and radicals in step (c).

3. The method of coating a substrate material as recited in claim 2 wherein the substrate material is carbon and is formed into a substrate positioned opposite the focus from the laser, and wherein the first gas is an $H_2$ and hydrocarbon mixture, the method including:

(e) heating the substrate to form a second plasma of ionized substrate material; and (f) combining the first plasma and second plasma behind the laser absorption wave so that carbon radicals in the presence of atomic hydrogen coat the substrate with diamond.

4. The method of coating a substrate material as recited in claim 2 wherein the substrate material is carbon and is formed into a substrate positioned opposite the focus from the laser, and wherein the first gas is an $H_2$ and $CH_4$ mixture, the method including:

(e) heating the substrate to form a second plasma of ionized substrate material;

(f) combining the first plasma and second plasma behind the laser absorption wave so that atomic hydrogen and carbon radicals combine to coat the substrate with carbon in crystalline form; and (g) controlling the amount of carbon to the amount of hydrogen present to thereby control the crystalline form of the carbon coating the substrate through a range of forms from disordered graphite to mixtures of disordered graphite and diamond to diamond.

5. The method of coating a substrate material as recited in claim 2 wherein the substrate material is hexagonal boron nitride and is formed into a substrate positioned opposite the focus from the laser, and wherein the first gas is $N_2$ so that the first plasma includes ionized nitrogen, the method including:

(e) heating the substrate to form a second plasma that includes ionized boron;

(f) combining the first plasma and second plasma behind the laser absorption wave so that atomic nitrogen, and atomic boron combine to coat the substrate with boron nitride having a cubic form; and (g) controlling the amount of boron to the amount of nitrogen present to control the crystalline form of the boron nitride coated on the substrate to the cubic form.

6. The method of coating a substrate material as recited in claim 2 wherein the substrate material is metallic and is formed into a substrate positioned opposite the focus from the laser, and wherein the first gas is an $H_2$ and $CH_4$ mixture, the method further including:

(e) heating the substrate to form a second plasma of ionized substrate material and particles of substrate material;

(f) combining the first plasma and second plasma behind the laser absorption wave so that carbon radicals in the presence of atomic hydrogen operate to coat the particles of substrate material with diamond; and (g) transporting the coated particles of substrate material to the substrate to form a metallic diamond composite.

7. The method of coating a substrate material as recited in claim 2 wherein the substrate material is formed into a substrate, further comprising:

(e) focusing the pulse of energy at a portion of the substrate to cause substrate material to separate from the portion of the substrate and mix with the first gas, the substrate material absorbing energy of the pulse to produce the at least first plasma comprised of constituents of the first gas and the substrate material.

8. The method of coating a substrate material as recited in claim 2 wherein the substrate material is formed into a substrate with a reflective surface, further comprising:

(e) directing the pulse of energy at the reflective surface so that the pulse of energy forms a focus after reflecting off the reflective surface to cause substrate material to heat and separate from the substrate and mix with the first gas at least between the focus of the pulse of energy and the surface of the substrate, the substrate material absorbing energy of the pulse to produce the at least first plasma comprised of constituents of the first gas and the substrate material.

9. The method of coating a substrate material as recited in claim 2 wherein the substrate material is metallic and is formed into a substrate positioned opposite the focus from the laser, and wherein the first gas is an $H_2$ and $CH_4$ mixture, the method further including:

(e) heating the substrate to form a second plasma of ionized substrate material and particles of substrate material;

(f) combining the first plasma and second plasma behind the laser absorption wave so that carbon radicals in the presence of atomic hydrogen operate to coat the particles of substrate material with diamond; and (g) capturing the coated particles of substrate material after they have cooled, whereby diamond microspheres are collected.

10. The method of coating a substrate material as recited in claim 1 wherein the first gas is a mixture comprised of hydrogen gas and hydrocarbon molecules and the layer resulting therefrom is comprised of diamond.

11. The method of coating a substrate material as recited in claim 1 wherein the first gas is comprised of $O_2$, the substrate material is comprised of Si, and the layer resulting therefrom is comprised of $SiO_2$.

12. The method of coating a substrate material as recited in claim 1 wherein the first gas is comprised of $N_2$, the substrate material is comprised of Si, and the layer resulting therefrom is comprised of silicon nitrides.

13. The method of coating a substrate material as recited in claim 1 wherein the first gas is a mixture comprised of carbon vapor and $H_2$, the substrate material is comprised of graphite, and the layer resulting therefrom is comprised of amorphic carbon.

14. The method of coating a substrate material as recited in claim 1 wherein the first gas is comprised of $N_2$, the substrate material is comprised of hexagonal boron nitride, and the layer resulting therefrom is comprised of cubic boron nitride.

15. The method of coating a substrate material as recited in claim 1 wherein the laser pulse is divided and a portion of the laser pulse is directed onto the substrate to heat the substrate so that a plasma in not formed in the first gas thereby.

16. The method of coating a substrate material as recited in claim 1 wherein the substrate material is in the form of a substrate having a substrate surface, the irradiating of (b) is performed with an unfocused laser beam pulse of sufficient intensity to transiently heat the substrate surface to a temperature sufficient to heat the adjacent first gas into a plasma.

17. The method of coating a substrate material as recited in claim 1 wherein the substrate material is in the form of a substrate having a substrate surface, including the simultaneous step with (b) of:

(e) providing a spray of laser energy absorbing material adjacent the substrate surface, the irradiating of (b) is performed with an unfocused laser beam pulse of sufficient intensity to heat the substrate surface to a temperature sufficient to heat the adjacent first gas into a plasma.

18. The method of coating a substrate material as recited in claim 1 wherein the first gas includes $N_2$, the substrate material includes carbon, and the layer is that results is comprised of $C_3N_4$.

19. The method of coating a substrate material as recited in claim 1 wherein step (b) includes:

(b1) varying the energy in the pulse of energy from the laser to control the morphology of the coating.

20. A method of coating a substrate material with a layer at least containing diamond comprising:

(a) providing hydrogen gas and a source of carbon;

(b) irradiating the hydrogen gas and the source of carbon with a pulse of energy from a laser to create at least a first plasma from the hydrogen gas and the source of carbon wherein ionized hydrogen and carbon is created;

(c) cooling the ionized hydrogen and carbon within the at least first plasma into neutral precursors comprising atomic elements and radicals; and (d) transporting the neutral precursors to the substrate material to form the diamond layer thereon.

21. The method as recited in claim 20 wherein step (b) includes:

(b1) focusing the pulse of energy into the hydrogen gas at a location spaced from the substrate material to form the at least first plasma into a laser absorption wave that travels back toward the laser to absorb the pulse of energy and to allow the ionized hydrogen and carbon between the laser absorption wave and the substrate to cool to atomic elements and radicals in step (c).

22. The method as recited in claim 20 21 including the additional steps of:

(e) heating the substrate material to form a second plasma of ionized substrate material; and (f) combining the first plasma and second plasma behind the laser absorption wave so that carbon radicals combine in the presence of atomic hydrogen to coat the substrate with diamond.

23. A method of creating a diamond layer on a carbon substrate material comprising:

(a) providing a non-carbon gas in molecular form, the non-carbon gas being capable of absorbing energy at frequencies produced by lasers and being at a pressure at which laser absorption waves can be produced;

(b) irradiating the non-carbon gas with focused pulses of energy from a laser to create laser absorption waves that move toward the substrate; and (c) spacing the focus of the focused pulses of energy from the laser at a distance from the carbon substrate material so that the laser absorption waves reacting toward the carbon substrate create pressure and temperature conditions thereat that convert the surface of the carbon substrate into diamond.

24. The method of creating a diamond layer as recited in claim 23 wherein the non-carbon gas is chosen from the group consisting of:

hydrogen; and nitrogen.

25. The method of creating a diamond layer as recited in claim 23 wherein step (b) includes:

irradiating the non-carbon gas with focused pulses of energy from a laser to create laser absorption waves that move toward the laser and react therefrom toward the substrate.

26. The method of creating a diamond layer as recited in claim 23 wherein step (b) includes:

irradiating the non-carbon gas with focused pulses of energy from a laser to create laser absorption waves that move toward the substrate and react therefrom toward the laser.

* * * * *